United States Patent [19]
Asano et al.

[11] Patent Number: 6,066,431
[45] Date of Patent: May 23, 2000

[54] PHOTOSENSITIVE RESIN FILM AND USE THEREOF

[75] Inventors: Masaaki Asano, Shinjuku-Ku; Takuma Hattori; Masami Yanagisawa, both of Shizuoka, all of Japan

[73] Assignees: Dai Nippon Printing Co., Ltd.; Tomoegawa Paper Co., Ltd., both of Japan

[21] Appl. No.: 09/128,412

[22] Filed: Aug. 4, 1998

[30] Foreign Application Priority Data

Aug. 19, 1997 [JP] Japan .................................. 9-236459

[51] Int. Cl.[7] .............................. G03C 11/06; G03C 5/56
[52] U.S. Cl. ........................... 430/198; 430/325; 430/330
[58] Field of Search .............................. 430/270.1, 281.1, 430/330, 325, 259, 18, 24, 256, 198; 313/567

[56] References Cited

U.S. PATENT DOCUMENTS 4,183,990   1/1980   Uchida et al. ........................... 428/212

FOREIGN PATENT DOCUMENTS 0768573   4/1997   European Pat. Off. .

*Primary Examiner*—Janet Baxter
*Assistant Examiner*—Yvette Clarke
*Attorney, Agent, or Firm*—Parkhurst & Wendel, L.L.P.

[57] ABSTRACT

There are provided a photosensitive resin film which can eliminate the step of development and the like, that is, can simplify the process, and in addition can form an even fluorescent substance layer in intimate contact with the surface of cells, and a back plate for PDP using the film. The photosensitive resin film comprises a substrate film and a pressure-sensitive adhesive, photosensitive resin layer provided on one side of the film, wherein the photosensitive resin layer comprises a photosensitive resin that contains a fluorescent substance and, upon exposure, causes the tackiness of exposed areas to be lowered.

8 Claims, 6 Drawing Sheets

PHOTOSENSITIVE RESIN FILM AND USE THEREOF

TECHNICAL FIELD

The present invention relates to a photosensitive resin film for fluorescent substance pattern formation, a fluorescent substance pattern, particularly a photosensitive resin film useful for the production of a fluorescent display device, such as a plasma display panel (PDP), and a process for producing a back plate for a PDP.

BACKGROUND OF THE INVENTION

In general, a PDP comprises two opposed glass substrates, a pair of electrodes systematically arranged in the glass substrates, and a gas (mainly Ne or the like) sealed therebetween. A voltage is applied across the electrodes to produce discharge within minute cells around the electrodes to emit light from each cell, thereby displaying information. Systematically arranged cells are selectively subjected to discharge luminescence in order to display information. Such PDPs are classified into two types, a direct current type PDP, wherein electrodes are exposed to a discharge space (DC type), and an alternating current type (AC type) wherein electrodes are covered with an insulating layer. Each of these types is further classified into a refresh drive system and a memory drive system according to display functions and drive systems.

Figure 7:
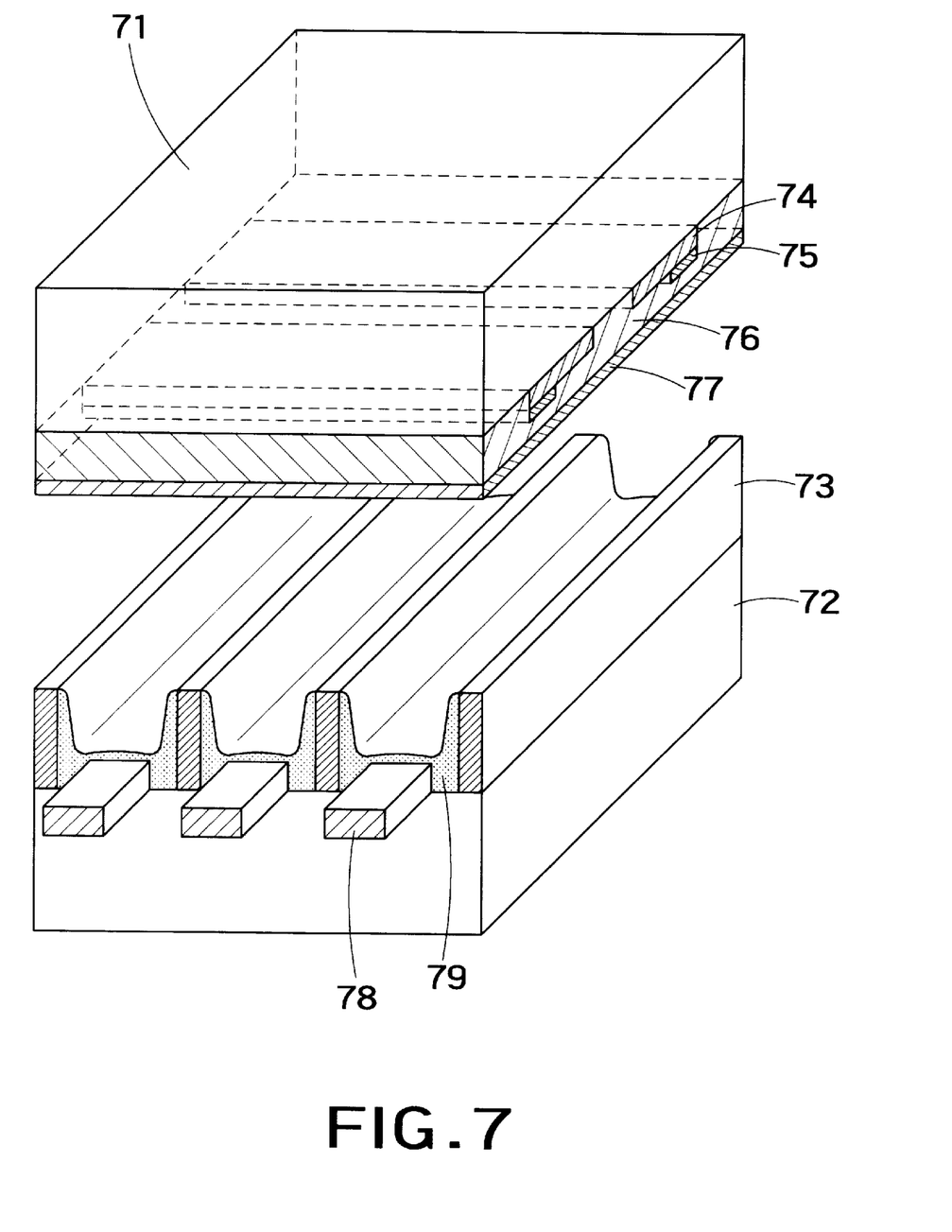
FIG. 7 is an explanatory view showing the construction of PDP.

FIG. 7 is an embodiment of the construction of an AC type PDP. In the drawing, a front plate 71 and a back plate 72 are shown separately from each other. As shown in the drawing, the glass front plate 71 and the back plate 72 are arranged parallel and opposite to each other. Barrier ribs 73 are provided so as to stand in a fixed state on the back plate 72 in its front surface side, and the front plate 71 and the back plate 72 are held while leaving a given distance between the front plate 71 and the back plate 72 by means of the barrier ribs 73. Composite electrodes each comprising a sustaining electrode 74 as a transparent electrode and a bus electrode 75 as a metallic electrode are provided parallel to each other on the front plate 71 in its back plate side, and a dielectric layer 76 is provided so as to cover the composite electrode. Further, a protective layer 77 (MgO layer) is provided on the surface of the dielectric layer 76.

On the other hand, address electrodes 78 are provided between the barrier ribs 73 on the back plate 72 in its front surface side so that the address electrodes 78 are parallel to each other and orthogonal to the composite electrodes. Further, a fluorescent substance 79 is provided so as to cover the wall surface of the barrier ribs 73 and the bottom face of cells.

In the AC type PDP, a predetermined voltage is applied, from an alternating-current power supply, across the composite electrodes on the front plate 71 to create an electric field, thereby producing discharge in each cell as a display element defined by the front plate 71, the back plate 72, and the barrier ribs 73. Ultraviolet light produced by the discharge permits the fluorescent substance 79 to emit light, and light passed through the front plate 71 is viewed by an observer.

Use of a photosensitive resin film constituted by a fluorescent substance-containing photosensitive resin layer has been proposed for coating the fluorescent substance (see, for example, Japanese Patent Laid-Open Publication Nos. 273925/1994, 95239/1996, and 95250/1996).

In this coating method, a photosensitive resin layer is pressed into cells formed in a back plate of a PDP, the photosensitive resin layer is then exposed and developed, followed by firing to burn off the organic material in the photosensitive resin layer, thereby forming a fluorescent substance layer on the surface of the cells. In this case, a satisfactorily large discharge space should be ensured in the cells after the firing, making it necessary to increase the content of the organic material in the photosensitive resin layer, that is, to lower the content of the fluorescent substance. This operation requires a large quantity of thermal energy for firing and further poses an additional problem that the firing evolves a large amount of decomposition gas, rendering the control of the firing oven complicated.

Further, the above method involves a serious problem that, since the photosensitive resin layer pressed into the cells contains a large amount of the organic material, the photosensitive resin layer shrinks with the elapse of the firing time and the finally formed fluorescent substance layer lifts from the cell surface and does not come into intimate contact with the cell surface.

In the above method, the step of exposure and development, that is, wet treatment, is indispensable for the formation of a patterned fluorescent substance layer in cells provided between adjacent barrier ribs. This renders the process complicated. Further, a developable resin, particularly an alkali-developable photosensitive resin, should always be used as the photosensitive resin. It is difficult to select a photosensitive resin that can be fully burned off.

Further, at the time of development, when the adhesion of the fluorescent substance-containing layer to the wall surface of the ribs is low, the fluorescent substance-containing layer is likely to be separated from the wall surface of the ribs. Development conditions should be optimized for the prevention of the separation.

Accordingly, an object of the present invention is to solve the problems of the prior art and to provide a photosensitive resin film that can eliminate the step of development and the like, realizing a simplified process, and in addition can form an even fluorescent substance layer in intimate contact with the cell surface, and a process for producing a back plate of PDP using the film.

DISCLOSURE OF THE INVENTION

The above object can be attained by the following present invention. Specifically, according to the present invention, there are provided a photosensitive resin film comprising: a substrate film; and a pressure-sensitive adhesive, photosensitive resin layer provided on one side of the substrate film, the photosensitive resin layer comprising a photosensitive resin that contains a fluorescent substance and, upon exposure, causes the tackiness of exposed areas to be lowered, a method for fluorescent substance pattern formation using the film, a process for producing a back plate for PDP using the film, and a back plate for PDP, produced by the process.

Figure 1:
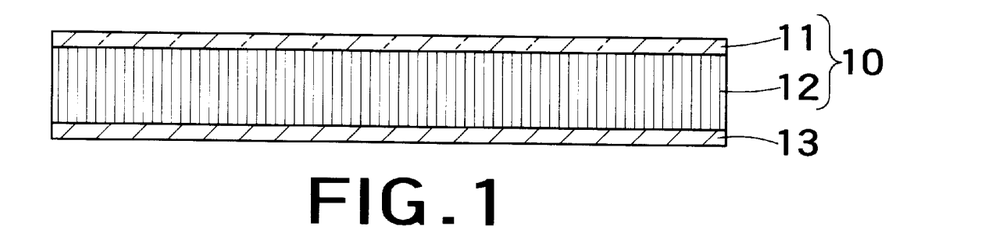
FIGS. 1 and 2 are diagrams showing the construction of a photosensitive resin film according to the present invention.
Figure 2:
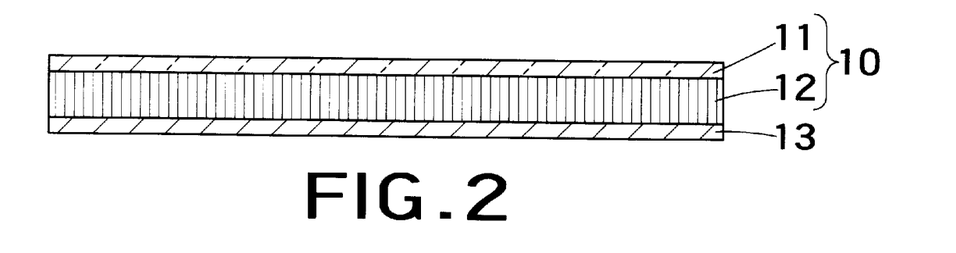
Figure 3A:
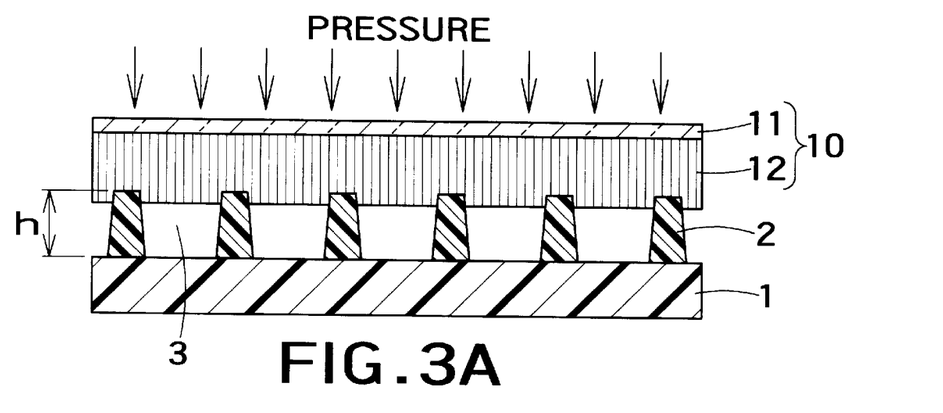
FIGS. 3 to 6 are diagrams showing the method according to the present invention.
Figure 3B:
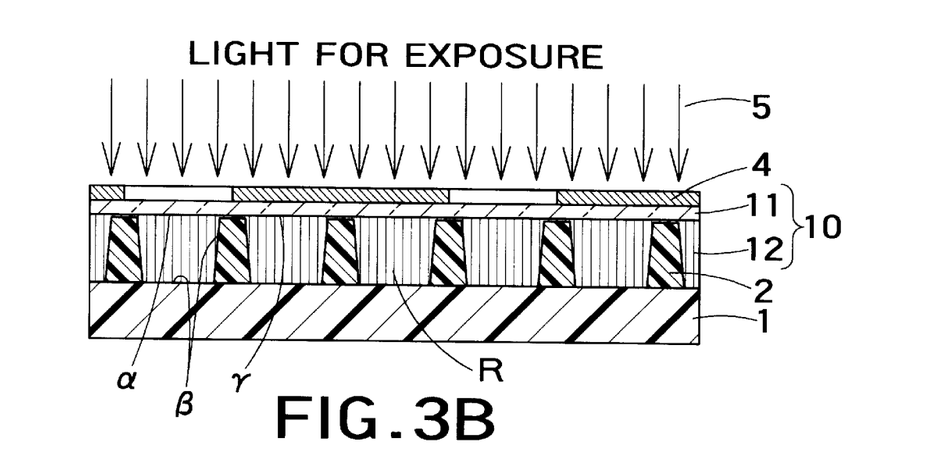

The photosensitive resin film according to the present invention has a construction shown in FIGS. 1 and 2. FIG. 2 is an embodiment wherein the thickness of a layer 12 in FIG. 1 has been reduced. Properties of the film shown in FIG. 1 will be described with reference to FIGS. 3A to 3C. As shown in FIG. 3B, a fluorescent substance-containing photosensitive resin layer 12 provided on a substrate film 11 is pressed into cells and then exposed to ultraviolet light or the like through a photomask 4. Upon exposure, in exposed areas in the interface of the substrate film 11 and the photosensitive resin layer 12, the tackiness α of the layer 12 to the substrate film 11 is significantly lowered as compared with the tackiness γ of the layer 12 to the substrate film 11 in the other areas, that is, unexposed areas, in the interface of the substrate film 11 and the photosensitive resin layer 12. Since a relatively large amount of a fluorescent substance is contained in the layer 12, the tackiness β in the interface of the inner surface of the cells 3 and the layer 12 is not significantly lowered. That is, regarding the tackiness, there is the following relationship: tackiness α< tackiness β< tackiness γ.

Figure 3C:
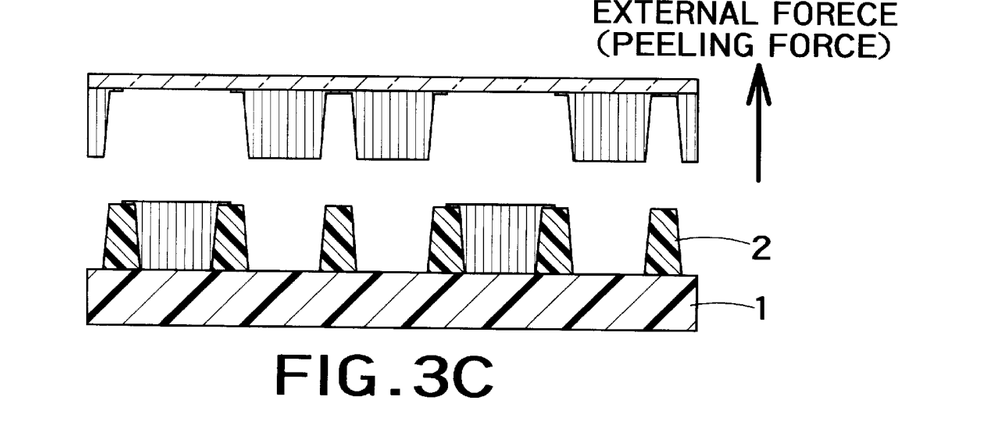

Therefore, as shown in FIG. 3C, when the substrate film is separated, the fluorescent substance-containing layer in the unexposed areas, together with the substrate film, is removed from within the cells, so that the fluorescent substance-containing layer only in the exposed areas remains filled within the cells. This, unlike the prior art, can eliminate the need to provide the complicated step of development in the pattern formation. The same principle is applied to the photosensitive resin film 10 in the embodiment shown in FIG. 2, and the embodiment shown in FIG. 2 will be described in detail later.

BEST MODE FOR CARRYING OUT THE INVENTION

The present invention will be described in more detail with reference to the following preferred embodiments.

The substrate film used in the photosensitive resin film according to the present invention may be any film so far as it is transparent or translucent. Examples thereof include about 10 to 80 μm-thick polyester, polypropylene, polystyrene and other plastic films.

The fluorescent substance-containing photosensitive resin layer provided on one side of the substrate film comprises a fluorescent substance and a pressure-sensitive adhesive, photosensitive resin as indispensable components. Fluorescent substances used in the present invention are not particularly limited. However, preferred are those wherein the matrix is constituted by a rare earth oxyhalide or the like and has been activated by an activator. Examples of ultraviolet excitation type fluorescent substances include: red-emitting fluorescent substances such as $Y_2O_3$: Eu, $YVO_4$:Eu, and $(Y,Gd)BO_3$:Eu; green-emitting fluorescent substances such as $Zn_2GeO_2$:Mn, $BaAl_{12}O_{19}$:Mn, $Zn_2SiO_4$: Mn, and $LaPO_4$:Tb; and blue-emitting fluorescent substances such as $Sr_5(PO_4)_3Cl$:Eu, $BaMgAl_{14}O_{23}$: $Eu^{2+}$, and $BaMgAl_{16}O_{27}$: Eu. Other fluorescent substances usable herein include: red-emitting fluorescent substances such as $Y_2O_3S$: Eu, γ-$Zn_3(PO_4)_2$:Mn, and $(Zn,Cd)S$:Ag+$In_2O_3$; green-emitting fluorescent substances such as ZnS:Cu, Al, ZnS:Au, Cu, Al, (Zn, Cd)S:Cu, Al, $Zn_2SiO_4$:Mn, As, $Y_3Al_5O_{12}$: Ce, $Gd_2O_2S$: Tb, $Y_3Al_5O_{12}$: Tb, and ZnO:Zn; and blue-emitting fluorescent substances such as ZnS:Ag+red pigment, and $Y_2SiO_3$:Ce. It is a matter of course that these fluorescent substances may be used as a mixture of two or more.

The pressure-sensitive adhesive, photosensitive resin used in the present invention comprises a base polymer (a), an ethylenically unsaturated compound (b), and a photopolymerization initiator (c). Examples of the base polymer (a) usable herein include cellulosic resins, such as ethylcellulose, hydroxyethylcellulose, ethylhydroxycellulose, hydroxypropylcellulose, methylcellulose, cellulose acetate, and cellulose acetate butyrate, vinyl resins, such as polyvinyl alcohol, polyvinyl acetate, polyvinyl butyral, polyvinyl acetal, and polyvinyl pyrrolidone, acrylic polymers and copolymers, for example, acrylic resins, such as poly(meth)acrylate and poly(meth)acrylamide, polyurethane resin, polyamide resin, and polyester resin.

Ethylenically unsaturated compounds (b) usable herein include monofunctional monomers, such as methyl (meth)acrylate, ethyl (meth)acrylate, propyl (meth) acrylate, butyl (meth) acrylate, hexyl (meth ) acrylate, 2-ethylhexyl (meth) acrylate, cyclohexyl (meth)acrylate, benzyl (meth)acrylate, dimethylaminoethyl (meth)acrylate, hydroxyethyl (meth ) acrylate, hydroxypropyl (meth ) acrylate, glycidyl (meth) acrylate, acrylamide, methacrylamide, acrylonitrile, methacrylonitrile, 2-hydroxyethyl (meth)acrylate, 2-hydroxypropyl (meth)acrylate, 2-hydroxybutyl (meth) acrylate, 2-phenoxy-2-hydroxypropyl (meth)acrylate, 2-(meth)acryloyloxy-2-hydroxypropyl phthalate, 3-chloro-2-hydroxypropyl (meth)acrylate, glycerin mono(meth)acrylate, 2-(meth)acryloyloxyethyl acid phosphate, acrylate-modified product of dicarboxylic acids, such as phthalic acid, N-methylol (meth)acrylamide, styrene, α-methylstyrene, vinyl acetate, alkyl vinyl ether, acrylic acid, methacrylic acid, crotonic acid, maleic acid, fumaric acid, itaconic acid, and anhydrides and monoesters thereof.

Polyfunctional ethylenically unsaturated compounds (b) usable herein include polyfunctional monomers, such as ethylene glycol di(meth)acrylate, diethylene glycol di(meth)acrylate, tetraethylene glycol di(meth)acrylate, propylene glycol di(meth)acrylate, polypropylene glycol di(meth)acrylate, butylene glycol di(meth)acrylate, neopentyl glycol di(meth)acrylate, 1,6-hexane glycol di(meth)acrylate, trimethylolpropane tri(meth)acrylate, glycerin di(meth)acrylate, pentaerythritol di(meth)acrylate, pentaerythritol tri(meth)acrylate, dipentaerythritol penta(meth)acrylate, 2,2-bis(4-(meth)acryloxydiethoxyphenyl)propane, 2,2-bis(4-(meth)acryloxypolyethoxyphenyl)propane, 2-hydroxy-3-(meth)acryloyloxypropyl (meth)acrylate, ethylene glycol diglycidyl ether di(meth)acrylate, diethylene glycol diglycidyl ether di(meth)acrylate, phthalic acid diglycidyl ester di(meth)acrylate, and glycerin polyglycidyl ether poly(meth)acrylate. The polyfunctional monomer may also be used in combination with a suitable amount of the above monofunctional monomer.

The amount of the ethylenically unsaturated compound (b) used based on 100 parts by weight of the base polymer (a) is preferably 5 to 200 parts by weight, particularly preferably 10 to 50 parts by weight. Use of the ethylenically unsaturated compound (b) in an excessively small amount results in unsatisfactory curing of the photosensitive composition, which causes unsatisfactory lowering in tackiness in the interface. On the other hand, when the amount of the ethylenically unsaturated compound (b) used is excessively large, the composition is near liquid, resulting in unsatisfactory shape retention of the formed photosensitive resin layer.

Photopolymerization initiators (c) usable herein include benzoin, benzoin methyl ether, benzoin ethyl ether, benzoin isopropyl ether, benzoin n-butyl ether, benzoin phenyl ether, benzyl diphenyl disulfide, benzyl dimethyl ketal, dibenzyl, diacetyl, anthraquinone, naphthoquinone, 3,3'-dimethyl-4-methoxybenzophenone, benzophenone, p,p'-bis (dimethylamino)benzophenone, p,p'-bis(diethylamino) benzophenone, p,p'-diethylaminobenzophenone, pivaloin ethyl ether, 1,1-dichloroacetophenone, p-t-butyldichloroacetophenone, a dimer of hexaarylimidazole, 2,2'-bis(o-chlorophenyl) 4,5,4',5'-tetraphenyl-1,2'-biimidazole, 2-chlorothioxanthone, 2-methylthioxanthone, 2,4-diethylthioxanthone, 2,2'-diethoxyacetophenone, 2,2'-dimethoxy-2-phenylacetophenone, 2,2'-dichloro-4-phenoxyacetophenone, phenyl glyoxylate, α-hydroxyisobutylphenone, dibenzosparon, 1-(4-isopropylphenyl)-2-hydroxy-2-methyl-1-propanone, 2-methyl-[4-(methylthio)phenyl]-2-morpholino-1-propanone, tribromophenylsulfone, and tribromomethylphenylsulfone. In this case, the total amount of the photopolymerization initiator (c) incorporated is suitably about 0.1 to 20 parts by weight based on 100 parts by weight in total of the base polymer (a) and the ethylenically unsaturated compound (b).

The fluorescent substance and other optional components may be incorporated into the photosensitive resin by any method without limitation, and.examples of methods usable herein include conventional methods, for example, a method wherein a predetermined amount of fluorescent substance and the like are added to the photosensitive resin followed by thorough mixing with agitation to homogeneously disperse the fluorescent substance. In this case, the content of the fluorescent substance is preferably such that 10 to 50% by weight, more preferably 20 to 30% by weight, of the photosensitive resin layer is accounted for by the fluorescent substance. When the fluorescent substance content exceeds 50 parts by weight, the amount of the fluorescent substance filled is so large that the discharge space cannot be ensured within the cells after firing. On the other hand, a fluorescent substance content of less than 10 parts by weight is unfavorable because the brightness of the fluorescent substance layer is likely to be lowered.

In the formation of a photosensitive resin layer according to the present invention, a volatile organic material may be incorporated into the photosensitive resin layer. In this case, according to the present invention, at least one of a plasticizer and a high-boiling organic solvent (hereinafter referred to simply as "volatile organic material") is particularly favorable as the volatile organic material. As shown in Table 1 below, volatile organic materials usable herein include dioctyl phthalate, dibutyl sebacate, trimethyl phosphate, triethyl phosphate, dicyclohexyl phthalate, and diheptyl phthalate. Volatilization in the step shown in FIGS. 4A or 4B can reduce the content of the organic material in the photosensitive resin layer filled into the cells, permitting the thermal energy required for firing to be reduced, and, at the same time, is useful for ensuring a large discharge space on the fluorescent substance layer shown in FIG. 4C. The volatile organic material used for this purpose is an organic compound that is compatible with the photosensitive resin and is not detrimental to the film-forming property of the photosensitive resin, and representative examples thereof usable herein include plasticizers that have hitherto been commonly used as those for vinyl chloride resins and the like. More specifically, for example, phthalic ester, fatty acid, or aromatic acid (di- or tribasic acid) ester and other conventional plasticizers may be used.

Other volatile organic materials usable herein include, for example, high-boiling organic solvents, such as glycerin, trimethylolpropane, ethylene glycol, diethylene glycol, triethylene glycol, propylene glycol, dipropylene glycol, lower alkyl ethers thereof, lower fatty acid esters, various higher fatty acids or esters thereof, and higher aliphatic alcohols or alkyl esters thereof. The volatile organic material referred therein should volatilize at 150 to 300° C.

As described above, depending upon the type of the photosensitive resin, the volatile organic material is used in such an amount that the film-forming properties of the photosensitive resin are not lost. The weight ratio of the photosensitive resin (A) to the volatile organic material (B) is generally A:B=40:60 to 90:10, preferably A:B=60:40 to 86:14. When the volatile organic material is used, the content of the fluorescent substance in the photosensitive resin composition is as described above.

Additives, such as dyes (coloring type and color former type), adhesion imparting agents, antioxidants, thermal polymerization inhibitors, solvents, surface tension modifiers, stabilizers, chain transfer agents, antifoaming agents, and flame retardants, may be optionally added. In particular, incorporation of silane, aluminum, or titanate coupling agents can improve the adhesion of the fluorescent substance layers finally formed within cells in the back plate of PDP to the cell surface. The coupling agent may be previously coated on the surface of the cells in the back plate of PDP.

The photosensitive resin film of the present invention may be formed by coating the photosensitive resin composition onto the surface of a suitable substrate film to form a photosensitive resin layer. In this case, if necessary, a protective film 13, for example, a polyethylene film or a polyvinyl alcohol film, may be applied onto the coating to prepare a laminate. The thickness of the photosensitive resin layer varies depending upon the content of the fluorescent substance and other components, the structure of the back plate and the like of PDP to be produced and other parameters and hence cannot be generalized. In general, however, the thickness is preferably 10 to 150 μm.

The method for pattern formation using a photosensitive resin film 10 shown in FIG. 1 will be described as a representative example of a process for producing a back substrate for a PDP. FIGS. 3 and 4 are diagrams illustrating processes for producing a back substrate for PDP using the photosensitive resin film 10. At the outset, the photosensitive resin film 10 is laminated onto the face of barrier ribs provided on the surface of a glass substrate 1, and the photosensitive resin layer is pressed into cells 3 formed between barrier ribs 2. The pressing can be easily carried out, for example, by using a heat roller or the like. In this case, use of a photosensitive resin film 10 comprising a photosensitive resin layer 12 having somewhat smaller thickness than the depth h of the cells 3 is preferred.

Next, as shown in FIG. 3B, ultraviolet light 5 is applied through a photomask 4 having a desired pattern. Upon exposure to the ultraviolet light, in the interface of the substrate film and the photosensitive resin layer, the tackiness γ in unexposed areas remains unchanged, while the tackiness α in exposed areas in the interface is lowered. In this case, since a fluorescent substance is contained in the photosensitive resin layer, the ultraviolet light does not satisfactorily reach the interface of the inner surface of the cell and the photosensitive resin layer, so that the tackiness of the interface β is not significantly lowered. As shown in FIG. 3C, in the separation and removal of the substrate film 11 after the exposure, due to the difference in tackiness among the interfaces, the photosensitive resin layer in its unexposed areas is separated and removed together with the substrate film while leaving the photosensitive resin layer in its exposed areas within the cells. In this case, the greater part of thickness of the photosensitive resin layer in its portion located on the top face of the barrier ribs is cut by the barrier ribs. Therefore, the patterning is very easy, and the photosensitive resin layer in its exposed areas is not separated and removed together with the substrate film.

Figure 4A:
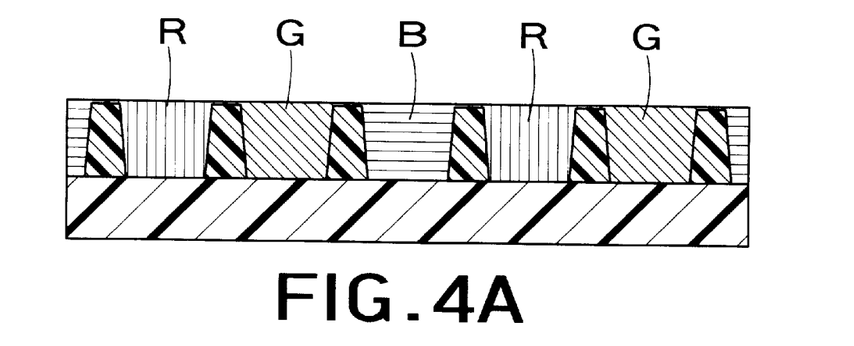
Figure 4B:
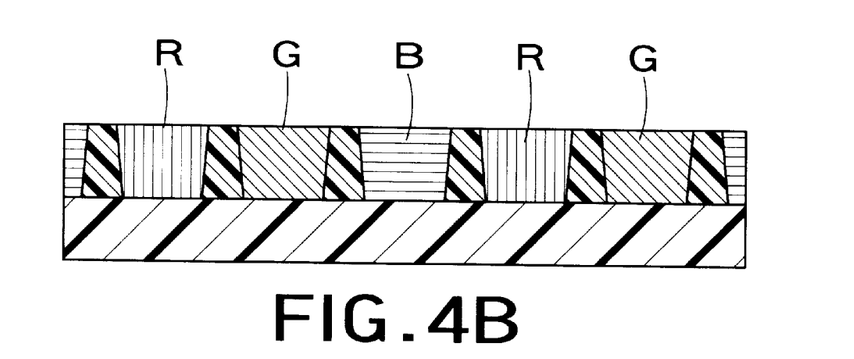
Figure 4C:
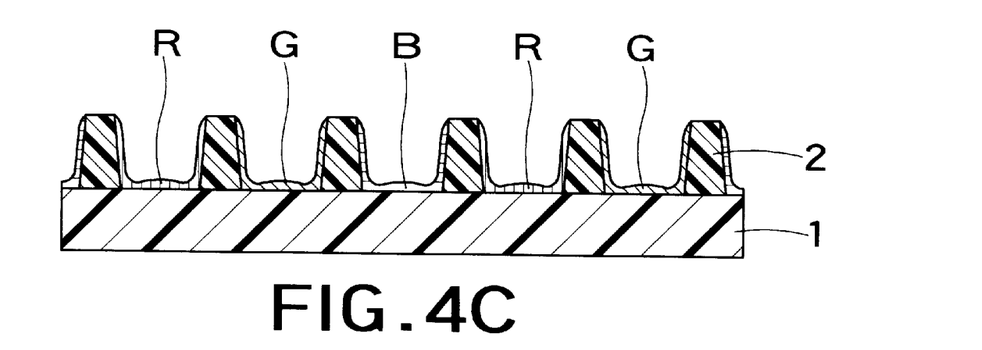

The fluorescent substance contained in the photosensitive resin layer in the photosensitive resin film 10 used is a red-emitting fluorescent substance R. Next, the above procedure is repeated, except that a photosensitive resin film containing a green-emitting fluorescent substance G is used instead of the photosensitive resin film containing a red-emitting fluorescent substance. Further, the above procedure is repeated, except that a photosensitive resin film containing a blue-emitting fluorescent substance B is used instead of the photosensitive resin film containing a red-emitting fluorescent substance. Thus, as shown in FIG. 4A, photosensitive resin layers containing fluorescent substances of three colors are filled into the cells 3. If necessary, as shown in FIG. 4B, the barrier rib faces may be ground to render the surface of the barrier rib faces flat. Finally, firing is carried out at a suitable temperature to form fluorescent substance layers of three colors RGB within cells, as shown in FIG. 4C. Fluorescent substances RGB may be filled into cells in any order.

In the above process, when the photosensitive resin layer in the photosensitive resin film contains a volatile material, the volatile material is removed by volatilization prior to firing.

Figure 5A:
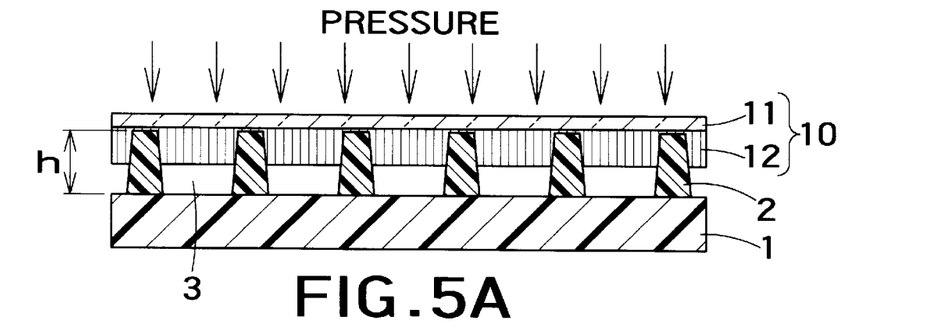
Figure 5B:
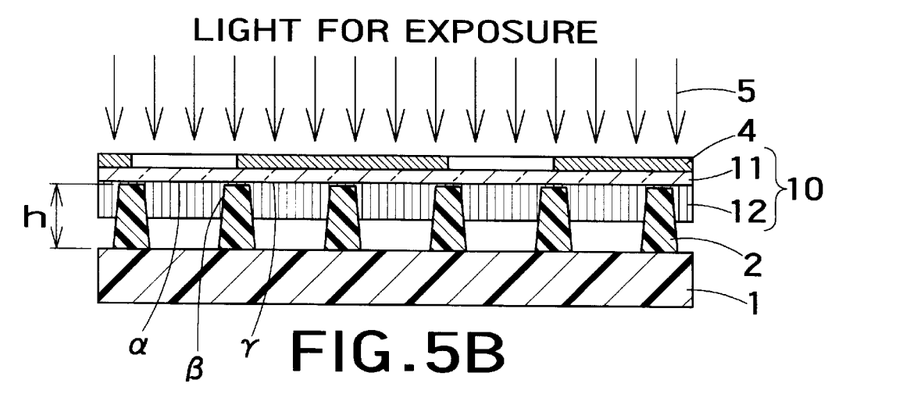
Figure 5C:
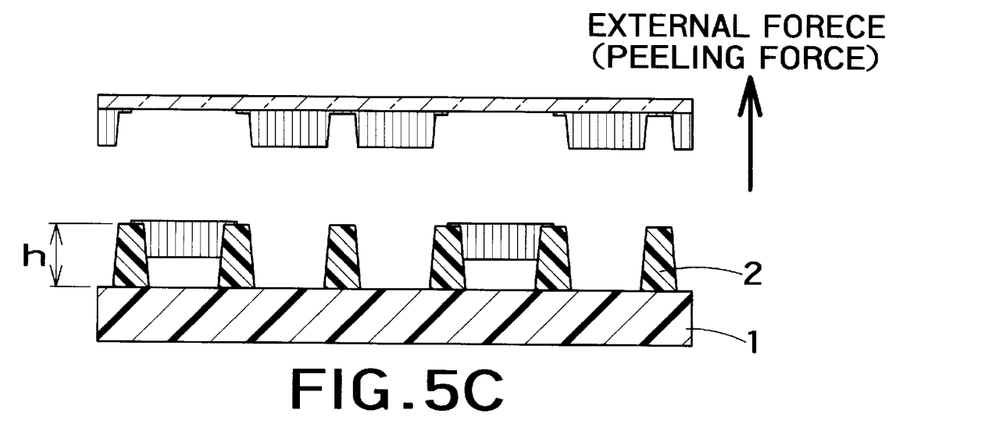

Next, a photosensitive resin film 10 according to the present invention shown in FIG. 2 will be described. The construction of the photosensitive resin film 10 shown in FIG. 2 is the same as that of the photosensitive resin film 10 shown in FIG. 1, except that the content of the fluorescent substance in the photosensitive resin has been increased by reducing the thickness of the photosensitive resin layer (that is, reducing the amount of the resin component) (in this case, the total amount of the fluorescent substance added is the same as that in the embodiment shown in FIG. 1). In this case, a thickness of one-eighth to three-eighth, preferably one-sixth to one-third, of the depth of cells formed in the back plate for PDP. The production process of a back plate for PDP using the photosensitive resin film 10 will be described with reference to FIGS. 5 and 6.

Figure 6A:
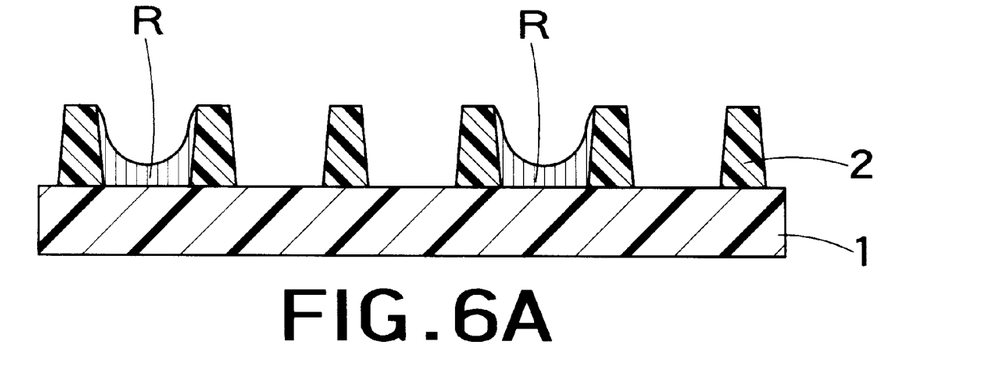

At the outset, the photosensitive resin film 10 is laminated onto the face of barrier ribs provided on the surface of the glass substrate 1, and the photosensitive resin layer is pressed into cells 3 formed between barrier ribs 2. Next, exposure is carried out through a photomask, and the substrate film is then separated and removed. As shown in FIG. 6A, a pressure is further applied to the photosensitive resin layer pressed into the cell 3 in its upper part to press the photosensitive resin layer into the cell until the photosensitive resin layer reaches the bottom of the cell (second pressing). Preferably, the second pressing is carried out by using air pressure, water pressure, a flexible resin or the like so that the ribs 2 are not damaged. Further, the temperature at the time of the pressing working is preferably about 80 to 120° C. from the viewpoint of satisfactorily softening the photosensitive resin layer. For example, when the second pressing of the photosensitive resin layer is carried out by air pressure, "noncontact gap molding/curing apparatus (LOPSKY)," manufactured by Ropuko may be used.

In this apparatus, a pressure in the form of an air film is applied to the photosensitive resin layer filled into the cells in their upper part to press the photosensitive resin layer into the cells. In this case, air is ejected through a very large number of holes in upper and lower gaseous film generators to apply a pressure to the photosensitive resin layer from above and below the back plate in such a state that the back plate is floated, thereby permitting the photosensitive resin layer to be pressed into the cells in their bottom. In this case, when the temperature of the air to be ejected from the apparatus is set at a suitable temperature, the photosensitive resin layer can be softened realizing easy and even pressing of the photosensitive resin layer.

The pressing of the photosensitive resin layer may be carried out using a hydraulic pressure, for example, a "water jet resin deburring apparatus (AX series)," manufactured by Rix Corp., instead of the air pressure. According to this apparatus, a pressure created by high-pressure water can be applied to the photosensitive resin layer filled into the cells in their upper part to press the photosensitive resin layer into the cells in their bottom. The apparatus is provided with a plurality of washing nozzles. Rotation of these nozzles at a high speed permits a water stream having a certain width to be ejected. Further, vibration of the nozzles enables a pressure to be applied to the whole surface of the back substrate with the photosensitive resin layer pressed thereinto to press the photosensitive resin layer into the cells in their bottom.

This apparatus has high operation reliability because a continuous ejection plunger pump having a maximum ejection pressure of 1500 kgf/cm$^2$ is used as a pressure-producing device instead of a high-pressure booster commonly used in the art. When the temperature of water to be ejected from this apparatus is set at a suitable temperature, the photosensitive resin layer can be softened realizing easy and even pressing of the photosensitive resin layer into the cells in their bottom.

When the fluorescent substance layer is pressed into the bottom of the cells by using a flexible resin, one example of a useful fluorescent substance layer pressing method comprises laminating a layer formed of a water-soluble resin onto the fluorescent substance layer, applying a pressure to press the water-soluble resin into the cells until the water-soluble resin reaches the bottom of the cells, thereby pressing the fluorescent substance layer into the cells in their bottom, and then dissolving and removing the water-soluble resin by washing or the like.

The fluorescent substance-containing photosensitive resin layer used in the present invention does not have a thickness large enough to fully fill the space of the cells. Therefore, the fluorescent substance content of the photosensitive resin layer can be increased by reducing the thickness of the photosensitive resin layer (that is, reducing the amount of the resin component). For example, the content of the fluorescent substance in the photosensitive resin layer is preferably about 50 to 90% by weight.

Figure 6B:
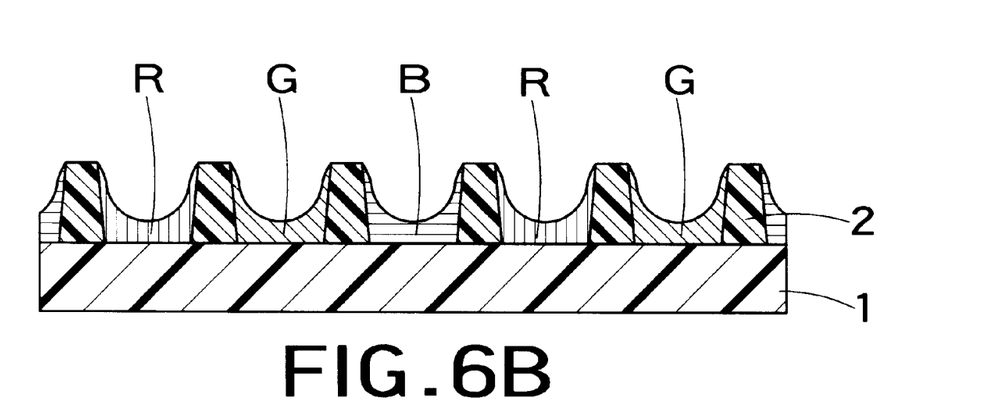
Figure 6C:
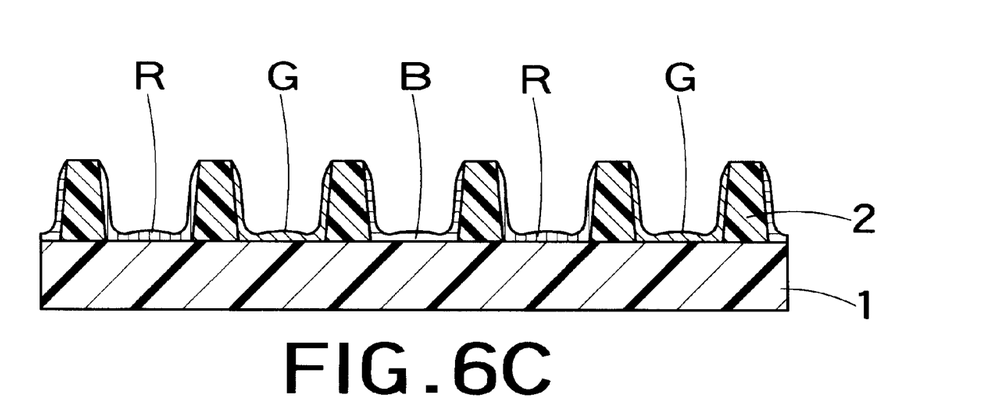

The fluorescent substance contained in the photosensitive resin layer in the photosensitive resin film 20 used is a red-emitting fluorescent substance R. Next, the above procedure is repeated, except that a photosensitive resin film containing a green-emitting fluorescent substance G is used instead of the photosensitive resin film containing a red-emitting fluorescent substance. Further, the above procedure is repeated, except that a photosensitive resin film containing a blue-emitting fluorescent substance B is used instead of the photosensitive resin film containing a red-emitting fluorescent substance. Thus, as shown in FIG. 6B, photosensitive resin layers containing fluorescent substances for three colors are filled into the cells 3. If necessary, the barrier rib faces may be ground to render the surface of the barrier rib faces flat. Finally, firing is carried out at a suitable temperature to form fluorescent substance layers for three colors RGB within cells, as shown in FIG. 6C. Fluorescent substances RGB may be filled into cells in any order. In this connection, it should be noted that, as with the above embodiment, in the above process, when the photosensitive resin layer in the photosensitive resin film contains a volatile material, the volatile material is removed by volatilization prior to firing. In the above methods, the firing temperature is generally 400 to 550° C.

The present invention will be described in more detail with reference to the following examples and comparative examples. In the following examples, "%" or "parts" is by weight unless otherwise specified.

EXAMPLE 1

Preparation of photosensitive resin composition 23 parts of the following base polymer, 27 parts of the following ethylenically unsaturated compound, 4 parts of the following photopolymerization initiator, 26 parts of the following fluorescent substance, and 17 parts of the following volatile organic material were mixed together to prepare photosensitive resin compositions for three colors. (Base polymer)

Methyl acrylate/2-ethylhexyl acrylate/acrylic acid copolymer (comonomer ratio (by weight)=25/70/5) (Ethylenically unsaturated compound)

A mixture of trimethylolpropane triacrylate/polyethylene glycol (MW:600) dimethacrylate/ethylene oxide modified phthalate acrylate (manufactured by Kyoeisha Chemical Co., Ltd.) in a weight ratio of 20/10/6. (Photopolymerization initiator)

A mixture of benzophenone/p,p'-diethylaminobenzophenone/2,2'-bis(o-chlorophenyl)-4,5,4',5'-tetraphenyl-1,2'-biimidazole in a weight ratio of 8/0.15/1.

| | (Fluorescent substance) | |
|---|---|---|
| Green fluorescent substance | Red fluorescent substance | Blue fluorescent substance |
| $(Zn,Mn)_2SiO_4$ | $(Y,Gd,Eu)BO_3$ | $(Ba,Eu)MgAl_{10}O_{17}$ |
| Kasei Optomix, Ltd. | Kasei Optomix, Ltd. | Kasei Optomix, Ltd. |
| P1-G1S | KX-504A | KX-501A |
| (PSS-O19) | (KRH-O11) | (KBH-O13) |
| Specific gravity 4.2 | Specific gravity 5.1 | Specific gravity 3.8 |

Average particle Average particle Average particle diameter 3.0 μm diameter 2.5 μm diameter 3.6 μm
(Volatile organic material)

Dioctyl phthalate (boiling point: 390° C. at 760 mmHg, 225–230° C. at 4 mmHg, volatilizable at 150 to 300° C.)
Preparation of Photosensitive Resin Film One color is selected from the above three colors, and the photosensitive composition for this color is coated onto a 25 μm-thick polyester film by means of an applicator (gap 4 mil), and the coating was allowed to stand at room temperature for 1.5 min and dried in an oven of 60° C., 90° C., and 110° C. each for 3 min, thereby forming a photosensitive resin film having a 120 μm-thick photosensitive resin layer for the selected color according to the present invention (in this case, no protective film is provided). Photosensitive resin films for the remaining two colors were prepared in the same manner as described above, except that the two colors were used. The 120 μm-thick photosensitive resin layer may be formed by repeating the coating procedure three times, a 40 μm-thick coating being formed for each coating procedure.

Lamination onto Glass Substrate

The photosensitive resin film was laminated onto a ribbed substrate (height 150 μm, width 50 μm, pitch 350 μm) under conditions of a laminating roll temperature of 100° C., a laminating roll pressure of 3 kg/cm², and a lamination rate of 1.5 m/min.

Exposure and Drying

After the lamination, a pattern mask was put on top of the surface of the photosensitive resin layer so that exposed areas, of a strip pattern, having a spacing of 200 μm parallel to the ribs at a pitch of 1050 μm are formed on the whole surface of the laminate, followed by exposure at 200 mJ of light from a 3 kw ultrahigh pressure mercury lamp by means of an exposing machine HMW-532D manufactured by Orc Manufacturing Corporation. After the exposure, a hold time of 15 min was provided, the polyester film was separated and removed to prepare an assembly as shown in FIG. 3C. The whole assembly was then dried in a drying oven of 250° C. and 4 mmHg for 10 min, thereby evaporating and removing dioctyl phthalate contained in the photosensitive resin layer.

Firing

After the drying, the temperature of the assembly was raised from room temperature to 450° C. in a firing oven over a period of one hr to burn off the resin component within the photosensitive resin layer, thereby forming a fluorescent substance layer.

EXAMPLES 2 to 7

Photosensitive resin compositions for three colors were prepared in the same manner as in Example 1, except that the content of the components constituting the photosensitive composition and the kind and content of the volatile organic material in Example 1 were varied as indicated in Table 1. Photosensitive resin films for three colors according to the present invention were prepared in the same manner as in Example 1, except that the photosensitive resin compositions for three colors prepared just above were used.

The form of the photosensitive resin films prepared in Examples 1 to 7 was as shown in FIG. 1.

TABLE 1

Examples 2 to 7
(Amount in parts within parentheses)

| Ex. | Base polymer | Ethylenically unsaturated compound | Photopolymerization initiator | Fluorescent substance | Volatile organic material |
|---|---|---|---|---|---|
| 2 | Same as Ex. 1 (46 parts) | Same as Ex. 1 (20 parts) | Same as Ex. 1 (8 parts) | Same as Ex. 1 (30 parts) | Dioctyl phthalate (10 parts) |
| 3 | Same as Ex. 1 (46 parts) | Same as Ex. 1 (20 parts) | Same as Ex. 1 (8 parts) | Same as Ex. 1 (30 parts) | Dibutyl sebacate (10 parts) |

TABLE 1-continued

Examples 2 to 7
(Amount in parts within parentheses)

| Ex. | Base polymer | Ethylenically unsaturated compound | Photopolymerization initiator | Fluorescent substance | Volatile organic material |
|---|---|---|---|---|---|
| 4 | Same as Ex. 1 (46 parts) | Same as Ex. 1 (20 parts) | Same as Ex. 1 (8 parts) | Same as Ex. 1 (30 parts) | Trimethyl phosphate (20 parts) |
| 5 | Same as Ex. 1 (46 parts) | Same as Ex. 1 (20 parts) | Same as Ex. 1 (8 parts) | Same as Ex. 1 (30 parts) | Triethyl phosphate (15 parts) |
| 6 | Same as Ex. 1 (46 parts) | Same as Ex. 1 (20 parts) | Same as Ex. 1 (8 parts) | Same as Ex. 1 (30 parts) | Dicyclohexyl phthalate (15 parts) |
| 7 | Same as Ex. 1 (46 parts) | Same as Ex. 1 (20 parts) | Same as Ex. 1 (8 parts) | Same as Ex. 1 (30 parts) | Diheptyl phthalate (15 parts) |

These photosensitive resin films were used to prepare back plates for PDP. Ribs in the back substrate for PDP had a height of 150 μm, a rib spacing of 350 μm, and a trough cell depth of 150 μm, a width of rib in its top portion of 50 μm, and a trough width of 300 μm.

The photosensitive resin film was put on the surface of the cell so that the photosensitive resin layer in the photosensitive resin film faced the surface of the cell. The assembly was then passed through between rubber rolls for lamination. Thus, the photosensitive resin layer was pressed into the cells. Thereafter, exposure was carried out through a photomask having a pixel pattern having the same color as the color emitted by the fluorescent substance in the same manner as in Example 1. The polyester film was then separated and removed to prepare an assembly shown in FIG. 3c. The whole assembly was then dried in a drying oven of 250° C. and 4 mmHg for 10 min, thereby evaporating and removing the volatile organic material contained in the photosensitive resin layer. Thereafter, firing was carried out in the same manner as in Example 1 to form a fluorescent substance layer, thereby preparing a back plate for PDP. The adhesion of the fluorescent substance layer in the back plate for PDP was visually inspected. As a result, all the fluorescent substance layers had good adhesion.

EXAMPLE 8
Preparation of Photosensitive Resin Composition 96 parts of n-butyl acrylate, 1 part of hydroxymethyl methacrylate, 3 parts of acrylic acid, 0.3 part of benzoyl peroxide, 40 parts of ethyl acetate, and 60 parts of toluene were placed in a flask equipped with a thermometer, a stirrer, a reflux condenser, and a nitrogen introduction tube. Nitrogen was then introduced into a nitrogen introduction tube to convert the atmosphere within the flask to a nitrogen atmosphere. The system was heated to 65° C., and polymerization was then allowed to proceed for 10 hr to prepare an acrylic polymer solution. 15 parts, based on 100 parts of the acrylic polymer, of trimethylolpropane triacrylate and 0.4 part, based on 100 parts of the acrylic polymer, of benzophenone were added to the solution to prepare an ultraviolet-curable pressure-sensitive adhesive. One part of a polyisocyanate (manufactured by Nippon Polyurethane Industry Co., Ltd., tradename Coronate L) was added to 100 parts, on a solid basis, of the pressure-sensitive adhesive. Further, 250 parts of the following fluorescent substance was added thereto followed by homogeneous dispersion. Thus, photosensitive, pressure-sensitive adhesive compositions for three colors were prepared.

The above composition was coated onto a 25 μm-thick PET (polyethylene terephthalate) film to a thickness on a dry basis of 30 μm, and the coating was then dried. A 38 μm-thick releasable PET film was temporarily attached as a protective layer onto the dried coating. Thus, photosensitive resin films for three colors according to the present invention were prepared.

| (Fluorescent substance) | | |
|---|---|---|
| Green fluorescent substance | Red fluorescent substance | Blue fluorescent substance |
| $(Zn,Mn)_2SiO_4$ Kasei Optomix, Ltd. P1-G1S (PSS-O19) Specific gravity 4.2 Average particle diameter 3.0 μm | $(Y,Gd,Eu)BO_3$ Kasei Optomix, Ltd. KX-504A (KRH-O11) Specific gravity 5.1 Average particle diameter 2.5 μm | $(Ba,Eu)MgAl_{10}O_{17}$ Kasei Optomix, Ltd. KX-501A (KBH-O13) Specific gravity 3.8 Average particle diameter 3.6 μm |

Lamination on Glass Substrate

The photosensitive resin film was laminated onto a glass substrate [a substrate, for a fluorescent substance face, having thereon a conductive circuit and a barrier ribs (height 150 μm, width 50 μm, pitch 350 μm)], which had been preheated at 60° C. in an oven, under conditions of a lamination roll temperature of 100° C., a lamination roll pressure of 3 kg/cm², and a lamination rate of 1.5 m/min.
Exposure and Drying After the lamination, a pattern mask was put on top of the surface of the laminate film so that exposed areas in a fluorescent substance face pattern form (line spacing 200 μm, pitch 1050 μm) were formed, followed by exposure at 400 mJ/cm² of light from a 3 kw ultrahigh pressure mercury lamp by means of an exposing machine MAP-200 manufactured by Dainippon Screen Mfg. Co., Ltd. After the exposure, a hold time of 15 min was provided, the polyester film was separated and removed to prepare an assembly shown in FIG. 5C. Thereafter, the photosensitive resin layer filled into the cells was air pressed under conditions of a pressure of 0.1 kg/cm² and a temperature of 100° C. for 5 min. Thus, as shown in FIG. 6A, the photosensitive resin layer was pressed into the cells until the photosensitive resin layer reached the bottom of the cells. The above procedure was repeated for the photosensitive resin films for the three colors. Thus, an assembly as shown in FIG. 6B was prepared.
Firing The temperature of the glass substrate with fluorescent substance layers for three colors filled therein was raised from room temperature to 450° C. in a firing oven over a period of one hr to burn off the resin component within the photosensitive resin layer, thereby forming fluorescent substance layers. Thus, a back plate for PDP was prepared. The fluorescent substance layers were satisfactorily adhered to the substrate, lifting of the fluorescent substance layers from the substrate was not observed at all, and a satisfactory discharge space could be ensured.

EXAMPLES 9 to 11

Photosensitive resin compositions were prepared in the same manner as in Example 8, except that the formulation of the photosensitive composition was varied as indicated in Table 2. Photosensitive resin films for three colors were then prepared in the same manner as in Example 8, except that the photosensitive resin compositions for three colors prepared just above were used.

The form of the photosensitive resin films prepared in Examples 8 to 11 was as shown in FIG. 2.

fluorescent substance layers. Thus, a back plate for PDP was prepared. The fluorescent substance layers were satisfactorily adhered to the substrate, lifting of the fluorescent substance layers from the substrate was not observed at all, and a satisfactory discharge space could be ensured.

Comparative Example 1

A photosensitive resin composition was prepared in the same manner as in Example 8, except that the formulation of the photosensitive composition was varied as indicated in Table 3. A photosensitive resin film was then prepared in the same manner as in Example 8, except that the photosensitive resin compositions prepared just above was used. A back plate for PDP (only for green) was formed in the same

TABLE 2

Examples 9 to 10

| Ex. | Base polymer | Trimethylol-propane triacrylate | Benzophenone/ polyisocyanate | Fluorescent substance | Volatile organic material |
|---|---|---|---|---|---|
| 9 | Same as Ex. 8 (100 parts) | Same as Ex. 8 (15 parts) | Same as Ex. 8 (0.4 part/1 part) | Same as Ex. 8 (250 parts) | None |
| 10 | Same as Ex. 8 (100 parts) | Same as Ex. 8 (15 parts) | Same as Ex. 8 (0.4 part/1 part) | Same as Ex. 8 (250 parts) | Dibutyl sebacate (20 parts) |
| 11 | Same as Ex. 8 (100 parts) | Same as Ex. 8 (15 parts) | Same as Ex. 8 (0.4 part/1 part) | Same as Ex. 8 (250 parts) | Trimethyl phosphate (25 parts) |

These photosensitive resin films were used to prepare back plates for PDP. Ribs in the back substrate of PDP had a height of 150 $\mu$m, a rib spacing of 350 $\mu$m, and a rib width of 50 $\mu$m. Therefore, the trough cell depth was 150 $\mu$m, and the trough width was 300 $\mu$m.

manner as in Example 8, except that the photosensitive resin film prepared just above was used. As a result, when the photosensitive resin film of Comparative Example 1 was used, the photosensitive resin layer in the photosensitive resin film could not be filled into the cells of the substrate.

TABLE 3

Comparative Example 1

| Comp. Ex. | Base polymer | Trimethylolpropane triacrylate | Benzophenone/ polyisocyanate | Volatile organic material | Fluorescent substance (green) | Results |
|---|---|---|---|---|---|---|
| 1 | 100 parts | 15 parts | None | None | 250 parts | x Impossible to fill |

The photosensitive resin film was put on the surface of the cell so that the photosensitive resin layer in the photosensitive resin film faced the surface of the cell. The assembly was then passed through between rubber rolls for lamination. Thus, the photosensitive resin layer was pressed into the cells. Thereafter, exposure was carried out through a photomask having a pixel pattern having the same color as the color emitted by the fluorescent substance in the cell in the same manner as in Example 8. The polyester film was then separated and removed to prepare an assembly shown in FIG. 5C. Air pressing was then carried out in the same manner as in Example 8. The above procedure was repeated for fluorescent substance compositions for three colors to prepare an assembly shown in FIG. 6b. Thereafter, firing was carried out in the same manner as in Example 8 to form

EXAMPLE 12

A back plate for PDP was formed in the same manner as in Example 8, except that pressing of the photosensitive resin film into the cells was carried out using a "water jet resin deburring apparatus (AX series)" manufactured by Rix Corp. at a water temperature of 80° C. and a water pressure of 5 kgf/cm². In the back plate, the fluorescent substance layer was satisfactorily adhered to the substrate, there was no lifting of the fluorescent substance layer, and a satisfactory discharge space could be ensured.

According to the present invention, the tackiness $\alpha$ of the photosensitive resin layer to the substrate film in exposed areas in the interface of the substrate film and the photosensitive resin layer is significantly lowered as compared with the tackiness $\gamma$ in the other areas, that is, unexposed areas, in the interface of the substrate film and the photosensitive resin layer. Therefore, when the substrate film is separated and removed, the fluorescent substance-containing layer in the unexposed areas is removed from within the cells while permitting only the fluorescent substance-containing layer in the exposed areas to remain filled into the cells. This can eliminate the need to provide a troublesome development step used in the prior art.

What is claimed is:

1. A method for forming a fluorescent substance pattern for a fluorescent display device, said method, comprising the steps of:

laminating onto the surface of a substrate a photosensitive resin film comprising (i) a substrate film and (ii) a pressure-sensitive adhesive, photosensitive resin layer provided on one side of the substrate film, said photosensitive resin layer including a photosensitive resin that contains a fluorescent substance and, upon exposure, causes the tackiness of exposed areas to be lowered;

pattern-wise exposing the photosensitive resin film;

separating and removing the photosensitive resin film from the surface of the substrate so that only exposed areas of the photosensitive resin layer remain on the surface of the substrate; and     firing the photosensitive resin layer formed on the substrate to obtain a fluorescent substrate pattern for a fluorescent display device,     said method including no developing step by means of a wet process.

2. A fluorescent substance pattern formed by the method according to claim 1.

3. The method for fluorescent substance pattern formation according to claim 1, wherein the substrate is a back plate for a plasma display panel.

4. A process for producing a back plate for a plasma display panel, said process comprising the steps of:

laminating onto the surface of a back plate for a plasma display panel a photosensitive resin film comprising (i) a substrate film and (ii) a pressure-sensitive adhesive, photosensitive resin layer provided on one side of the substrate film, said photosensitive resin layer including a photosensitive resin that contains a fluorescent substance and, upon exposure, causes the tackiness of exposed areas to be lowered;

pattern-wise exposing the photosensitive resin film;

separating and removing the photosensitive resin film from the surface of the substrate so that only exposed areas of the photosensitive resin layer remain on the surface of the substrate; and     firing the photosensitive resin layer formed on the substrate to obtain a back plate for a plasma display panel,     said process including no developing step by means of a wet process.

5. The process for producing a back plate for a plasma display panel according to claim 4, further comprising     pressing the photosensitive resin layer into cells between barrier ribs of the back plate after lamination of the photosensitive resin film.

6. The process for producing a back plate for a plasma display panel according to claim 5, wherein the photosensitive resin layer is pressed into the cells by using air pressing, water jetting, or a thermoplastic resin.

7. A back plate for a plasma display panel, produced by the process according to claim 4.

8. A plasma display panel provided with the back plate for a plasma display panel according to claim 7.

\* \* \* \* \*